United States Patent [19]

Hazama

[11] Patent Number: 4,718,767
[45] Date of Patent: Jan. 12, 1988

[54] METHOD OF INSPECTING THE PATTERN ON A PHOTOGRAPHIC MASK

[75] Inventor: Junji Hazama, Kawasaki, Japan
[73] Assignee: Nippon Kogaku K.K., Tokyo, Japan
[21] Appl. No.: 657,068
[22] Filed: Oct. 2, 1984
[30] Foreign Application Priority Data Oct. 3, 1983 [JP] Japan ............................... 58-183136

[51] Int. Cl.⁴ ............................................. G01K 11/00
[52] U.S. Cl. ..................................... 356/381; 356/314
[58] Field of Search ........................ 356/394, 398, 389

[56] References Cited

U.S. PATENT DOCUMENTS

| | | | |
|---|---|---|---|
| 3,617,744 | 11/1971 | Irish | 356/394 |
| 3,963,354 | 6/1976 | Feldman et al. | 356/394 |
| 4,131,472 | 12/1978 | MacDonald, Jr. et al. | 356/389 |
| 4,200,396 | 4/1980 | Kleinknecht et al. | 356/394 |
| 4,209,257 | 6/1980 | Uchiyama et al. | 356/394 |

Primary Examiner—R. A. Rosenberger
Assistant Examiner—Crystal D. Cooper
Attorney, Agent, or Firm—Michael N. Meller

[57] ABSTRACT

A method whereby the circuit pattern on a photographic mask or a reticle used in the manufacture of semiconductor devices is inspected for defects by an image processing technique. In this inspection method, the pattern of the mask is printed on a photosensitive member prepared by forming an opaque or semitransparent photosensitive layer on a transparent substrate and an image of the printed pattern formed on the photosensitive member is inspected by the image processing technique.

8 Claims, 10 Drawing Figures

METHOD OF INSPECTING THE PATTERN ON A PHOTOGRAPHIC MASK

BACKGROUND OF THE INVENTION

The present invention relates to a method of inspecting the pattern on a photographic mask used in the manufacture of semiconductor devices, and more particularly the invention relates to a method of inspecting for the presence of defects in a photographic mask such as foreign particles, e.g., dust deposited on the surface of the mask and flaws caused in the mask surface during the mask cleaning process and the like.

In the recent manufacturing procedures of LSIs and VLSIs, the photoengraving process has been made increasingly precise and the tendency of circuit patterns has been toward further reduction in linewidth. Paralleling this, there has been a proportionate increase in the occurrence of a situation in which foreign particles, e.g., dust suspended or generated in the production environment deposits on a photographic mask or a reticle and causes defects in semiconductor devices.

Recently, exposure apparatus of the type repeatedly projecting a reduced image of a pattern onto a plurality of areas on a semiconductor wafer has been watched and used widely. If a photographic mask or a reticle contaminated with such foreign particles is used as a master plate for the pattern projection in this type of exposure apparatus, defects will be caused in all of the exposed areas and the yield of produced semiconductor devices will be decreased. Thus, it is essential to exactly inspect preliminarily for the presence of foreign particles on a mask or a reticle.

Methods heretofore known for inspecting the pattern of a mask or reticle include one in which the pattern of a mask or reticle is printed on a wafer and the wafer is inspected with the naked eye through an optical microscope. While this method effects the defect inspection of the pattern on a mask or reticle with the mask or reticle being mounted in place in the exposure apparatus, thereby performing the inspection which meets the production environment, there is a disadvantage in that the method requires much time and is low in reliability due to the macroscopic inspection with the use of an optical microscope. Another known method inspects a mask or a reticle itself and this method is still insufficient for producing defect-free semiconductor devices in that there is the danger of dust or the like depositing on the inspected mask at the stage of mounting it in the exposure apparatus.

SUMMARY OF THE INVENTION

With a view to overcoming the foregoing deficiencies in the prior art, it is an object of the present invention to provide an improved new method for inspecting the pattern on a photographic mask or reticle for pattern defects.

In accordance with the invention there is thus provided a pattern inspection method comprising the steps of arranging on a focusing plane of an exposure apparatus a photosensitive member made by forming an opaque or semi-transparent photosensitive layer on a transparent substrate, projecting the pattern of a mask or reticle onto the photosensitive layer of the photosensitive member, developing the photosensitive member exposed to the projected image of the pattern, generating an image signal corresponding to the contrast of the pattern on the developed photosensitive member and detecting for the presence of defects in the pattern on the photosensitive member in accordance with the image signal.

In performing the method of this invention, the transparent substrate should preferably be composed of a transparent glass or a transparent semiconductor wafer and also the opaque photosensitive layer may be provided by forming a film of a photoresist on a layer of a metal such as aluminum or the semitransparent photosensitive layer may be provided by a layer of a photoresist incorporating a coloring matter.

In accordance with this method, the pattern of the mask or reticle is printed on the developed photosensitive member in the form of a pattern having a high contrast due to the area having the photosensitive layer removed by the development, thereby exposing the transparent substrate and other areas retaining the light shielding or semitransparent photosensitive layer.

DESCRIPTION OF THE PREFERRED EMBODIMENTS

Figure 1:
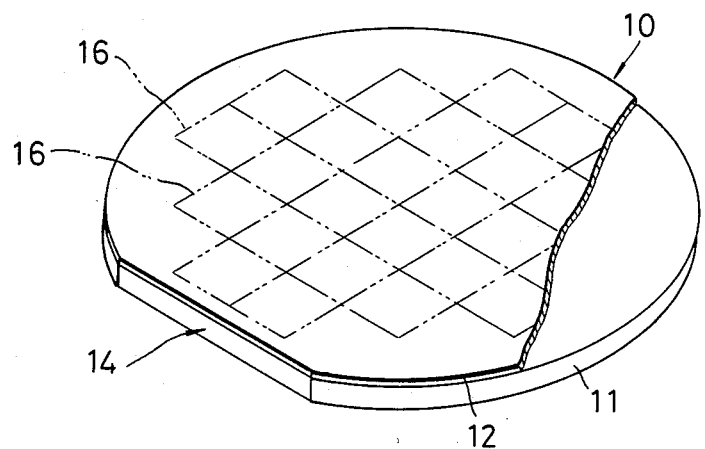
FIG. 1 is a perspective view showing an embodiment of a photosensitive member used with the present invention.

FIG. 1 shows a photosensitive member 10 including a photosensitive layer 12 composed of a film of an opaque or semitransparent material formed on a transparent substrate 11. The transparent substrate 11 is made of glass of the same material as used for the ordinary photographic masks, etc., or a transparent semiconductor wafer such as a silicon-on-sapphire wafer or a gallium cadmium garnet wafer. Then, the photosensitive member 10 should preferably be formed to have the same shape and size as the ordinary semiconductor wafer. By so doing, it is possible to mount the member 10 as such on the focusing plane of the exposure apparatus without the provision of any special jig. The illustrated photosensitive member 10 is formed with a flat 14 of the same type as the orientation flat of the ordinary wafer which is used for rough alignment purposes. The photosensitive layer 12 is composed of a thin film of a photoresist incorporating a coloring matter.

Figure 2:
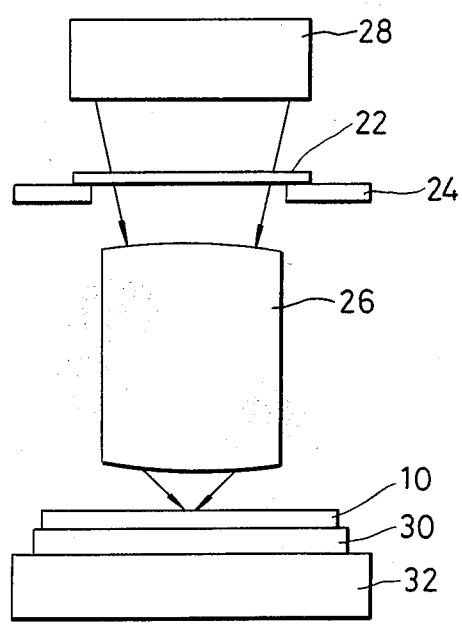
FIG. 2 is a schematic front view of an exposure apparatus.

FIG. 2 shows a projection exposure apparatus. A mask or reticle 22 to be inspected is supported on a holder 24, arranged above a projection lens system 26 and illuminated by an illuminating unit 28. The illuminating light beam passed through the pattern on the mask or reticle 22 to be inspected and the projection lens system 26 is focused onto the photosensitive member 10 mounted on a holder 30 on a movable stage 32.

Figure 3:
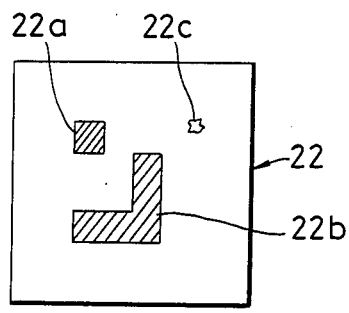
FIG. 3 is a plan view of a photographic mask or a reticle.

The pattern formed on the mask or reticle 22 is such as shown in FIG. 3.

Figure 4:
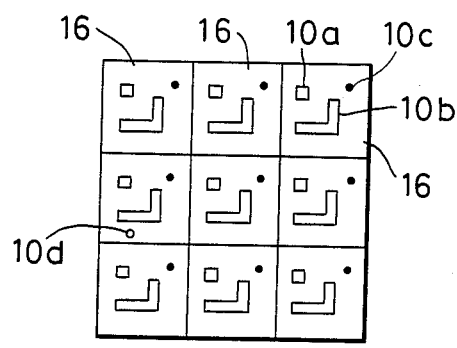
FIG. 4 shows a plurality of patterns on the photosensitive substrate formed by printing the pattern of the mask or reticle shown in FIG. 3.

In FIG. 3, numerals 22a and 22b designate a normal circuit pattern formed on the mask 22, and 22c foreign particles such as dust deposited on the mask 22. This mask pattern is projected by the exposure apparatus onto the photosensitive layer 12 of the photosensitive member 10. Then, the exposed photosensitive member 10 is developed so that the exposed portions of the photosensitive layer 12 are removed and the photosensitive layer portions of the pattern shape corresponding to the mask pattern are left on the photosensitive member 10. FIG. 4 shows the patterns of the photosensitive layer left on the photosensitive member 10 after the development.

The exposure apparatus shown in FIG. 2 repeatedly performs a reduction projection of the same pattern on the mask 22 through the projection lens system 26 onto a plurality of exposure areas 16 on the photosensitive member 10 while moving the stage 32. As a result, a printed pattern including a residual resist 10c corresponding to the foreign particles on the mask 22 and residual resists 10a and 10b corresponding to the normal pattern is formed on each of the exposure areas 16 on the photosensitive member 10. Thus, by forming a plurality of (at least two) printed patterns on the different areas of the photosensitive member, it is possible to compare the printed patterns with each other and thereby determine whether the foreign particles are present on the mask to be inspected or the photosensitive member. In the case of FIG. 4, for example, it is determined that the residual resist 10c is due to the foreign particles on the mask since it is present in common to all the printed patterns and that the residual resist 10d is due to the foreign particles on the photosensitive member 10 since it is not present in the other printed patterns.

Figure 5:
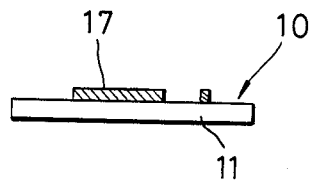
FIG. 5 is a partial side view of a photosensitive member after development.

FIG. 5 shows a partial sectional view of a developed photosensitive member 10 in which an opaque or semitransparent layer 17 of the residual resist is present on a transparent substrate 11.

Figure 6:
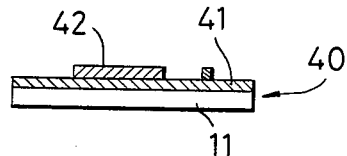
FIG. 6 is a partial side view of a photosensitive member which has been developed and including a photosensitive layer with a metal film.
Figure 7:
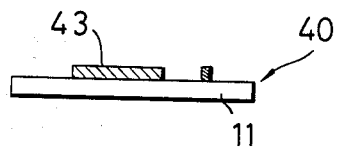
FIG. 7 is a side view of the photosensitive member after etching.

By projecting the pattern of a mask to be inspected onto a photosensitive member 40 prepared by providing a metal layer such as an aluminum layer on a transparent substrate 11 and applying a photoresist onto the metal layer, developing the photosensitive member 40 and removing the exposed photoresist, a printed pattern 42 of the residual resist corresponding to the mask pattern is formed on the metal layer 41 as shown in FIG. 6. Then, the metal layer 41 is removed by etching and an opaque metal pattern 43 is formed on the transparent substrate 11 as shown in FIG. 7.

In these cases, each of the printed patterns 17 and 43 is either opaque to light or low in light transmittance with respect to the transparent substrate 11 and thus the contrast is improved.

Next, a description will be made of the inspection method for detecting the presence of defects in the printed patterns formed on a photosensitive member in the above-mentioned manner and detecting the presence of foreign particles on a mask to be inspected.

Figure 8:
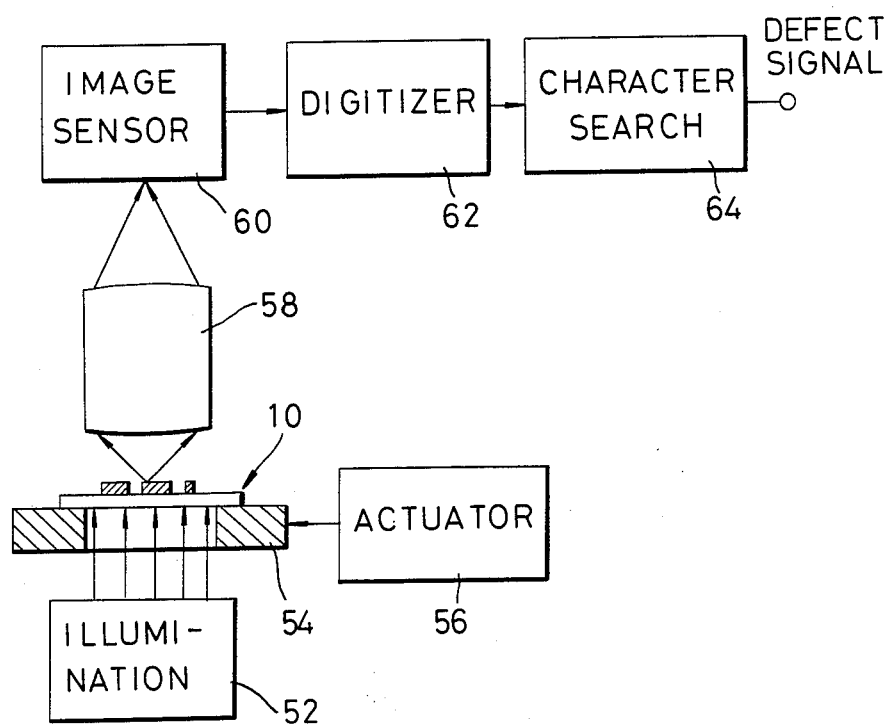
FIG. 8 is a block diagram showing the construction of an embodiment of the invention.

The printed patterns formed on the photosensitive member in this way are inspected by the apparatus shown in FIG. 8. In the FIG., numeral 52 designates an illuminating light source, 54 a stage holding thereon the photosensitive member 10 having the above-mentioned printed patterns and movable by an actuator 56, and 58 an objective lens whereby an image of the printed pattern of the photosensitive member 10 illuminated by the transmitted illuminating light from the illuminating light source 52 is focused on an image sensor 60 comprising a CCD or ITV. The image sensor 60 scans the projected image of the printed pattern and generates a time series signal or an analog image signal corresponding to the light and dark of the projected image or the contrast of the photosensitive member 10.

The analog image signal generated from the image sensor 60 is converted to logical levels and generated as a digitized image signal through a digitizer 62. In this case, the improved contrast of the photosensitive member 10 ensures a satisfactory contrast for the analog image signal and therefore the analog image signal is easily digitized by the digitizer 62. The digitized image signal is transferred to a character search system 64 so that a portion having characteristic properties of foreign particles is extracted from the image signal and the portion is generated as a defect signal. More specifically, generally the shape of a printed pattern produced by foreign particles on a mask or reticle has characteristic properties which are different from those of a normal circuit pattern. For example, the printed pattern is smaller in linewidth than the minimum linewidth in the pattern design and the edge direction components of the pattern are unnatural. These characteristic properties are extracted and a defect signal is generated. The information of the foreign particles on the mask is detected from the defect signal.

On the other hand, if a thin film of a resist incorporating a reddish coloring matter is used for the photosensitive layer on the transparent substrate of the photosensitive member 10 and the illuminating light from the light source 52 is projected through a filter as a bluish illuminating light onto the photosensitive member 10, an analog image signal having an excellent contrast is generated from the image sensor 60 and the signal is easily digitized by digitizer 62. It is to be noted that, as a specific example of the character search system 64, the method disclosed in U.S. patent application Ser. No. 381,469 filed on May 24, 1982 by the applicant, now U.S. Pat. No. 4,472,738, that is, the method which examines whether the linewidth of a pattern is made as specified by the design rule or the pattern is an isolated pattern with the use of a specially designed template, can be used as such for the character search system 64.

Figure 9:
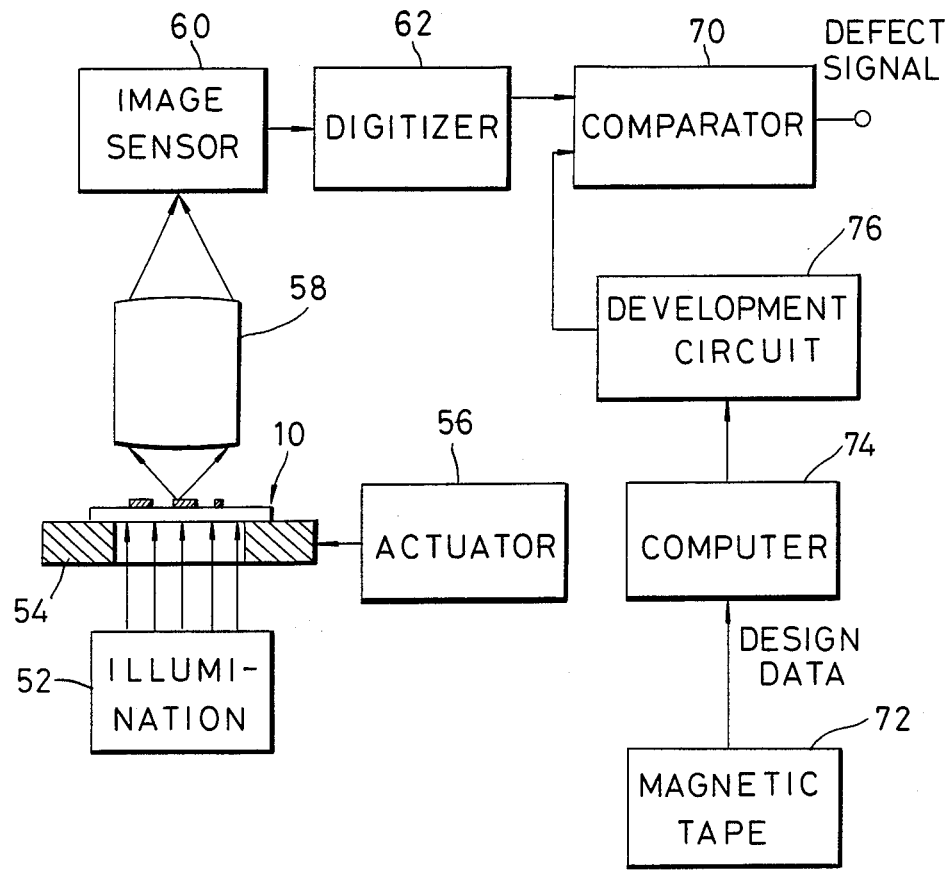
FIG. 9 is a block diagram showing the construction of another embodiment of the invention.

FIG. 9 shows another embodiment of the invention for inspecting the printed patterns on a photosensitive member. In the FIG., the same reference numerals as used in FIG. 8 designate the identical components. The objective lens 58 forms an image of the printed pattern on the photosensitive member 10 and the image is converted to an analog image signal by the image sensor 60. This analog image signal is applied to the digitizer 62 so that the signal is converted to a digitized image signal and applied to one input terminal of a comparator 70. On the other hand, the design data of the circuit patterns on the masks are stored in a magnetic tape 72. A computer 74 reads in the design data stored in the magnetic tape 72 and stores them in an internal memory. Of the design data stored in the computer 74, the design data corresponding to the mask to be inspected is supplied to a design image development circuit 76 and the data is applied to the other input terminal of the comparator 70 in synchronism with the digitized image signal for comparison therewith.

The design data is formed as a set of values necessary for indicating a large number of rectangular pattern elements forming the circuit pattern and each of the rectangular pattern elements is represented by five parameters including the central coordinate (X,Y) of a given coordinate system on the mask, a width W, a height H and a rotational angle $\theta$ with respect to the coordinate axes.

The mask pattern design data represented by the parameters are separately generated from the computer 74 for each of the rectangular pattern elements in terms of seven signals $X_1$, $X_2$, $X_3$, $X_4$, $Y_1$, $Y_4$ and $\theta$. These seven signals are defined as follows. In other words, where the area to be inspected is represented by X-Y coordinates, the seven signals correspond to the coordinates $(X_1, Y_1)$, $(X_2)$, $(X_3)$, $(X_4, Y_4)$ of four angular positions $P_1$, $P_2$, $P_3$ and $P_4$ of each rectangular pattern element and a rotational angle $\theta$.

Figure 10:
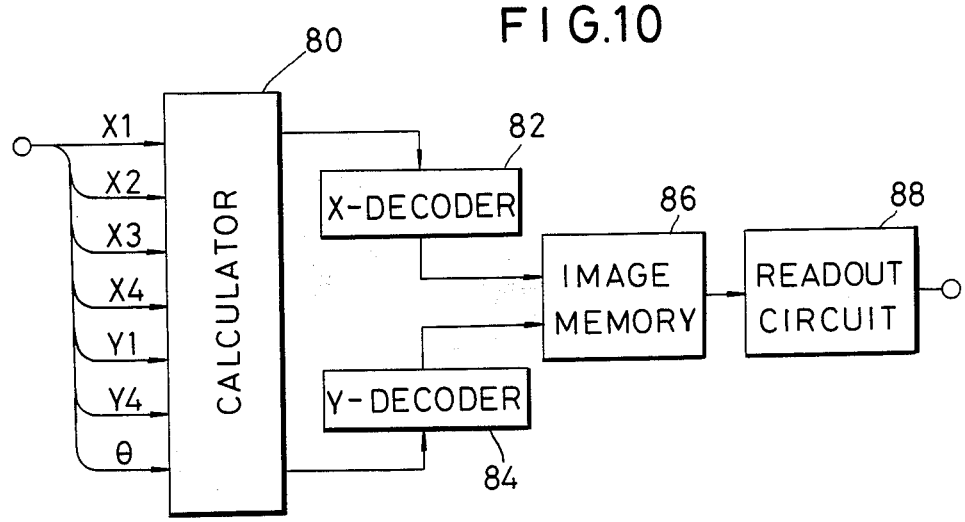
FIG. 10 is a block diagram of the development circuit.

These seven signals are applied to the development circuit 76 shown in FIG. 10.

The development circuit 76 basically comprises a calculator 80, decoders 82 and 84, an image memory 86 which is accessed bit by bit in accordance with the address information generated from the decoders and a readout circuit 88.

The calculator 80 receives the above-mentioned seven signals and the signals $X_1$ and $Y_1$ are respectively set in an internal X-counter and an internal Y-counter which are not shown. The value of the set signal $X_1$ is decoded by the X-decoder which always accesses the X-direction bits of the image memory 86 and the value of the signal $Y_1$ is similarly decoded by the Y-decoder 84 which accesses the Y-direction bits, thereby generating these values as address information. The X-counter storing the signal $X_1$ increases its value by 1 at a time until the value becomes equal to $X_1$ (the point $P_2$). During the interval, a logic "1" is set in each of the corresponding bits on the image memory 86. When the count attains the value of $X_2$, the X-counter is again set to $X_1$ and the Y-counter storing the signal $Y_1$ is increased by 1. Then, as mentioned previously, a "1" is set in each of the corresponding bits of the image memory 86 until the Xcounter attains the value of $X_2$. This operation is repeated until the Y-counter becomes equal to the value of $Y_4$. In this way, the same bit pattern as the rectangular pattern according to the design values is produced on the image memory 86.

When all the bit patterns according to the design data of the inspection area are written in the image memory 86, the readout circuit 88 accesses the addresses of the image memory 86 and successively reads out the binary signals from the corresponding bits in synchronism with the digitized image signal from the digitizer 62, thereby making a comparison between the two in the comparator 70. In this case, the comparator 70 may be provided with a character search circuit so that the characteristic properties of the design pattern and the pattern on the mask are detected and compared to determine whether the detected features are equal to each other.

As an example of the above character detection, it is possible to detect the presence of angles in a pattern as well as the degrees, directions, etc., of the angles as disclosed in U.S. patent application Ser. No. 400,681 filed on July 22, 1982, now U.S. Pat No. 4,479,145. In this case, the inspection can be accomplished by examining whether the angles present at the specified positions of the design pattern are present at the corresponding positions of the printed pattern image or conversely by examining, upon detection of the presence of any image of foreign particles (dust or flaw) at a certain position of the printed pattern image, whether any pattern is present at the corresponding position of the design pattern.

There is another comparison method in which the number of transitions in logical value in each scanning line is counted from a digitized image signal and then compared with the number of transitions in logical value in the bit string of the frame memory corresponding to the scanning line, thereby detecting the presence of foreign particles.

In any case, if there is a difference between the printed pattern image information of the photosensitive member 10 and the design pattern information of the mask which were compared by the comparator 70, a defect signal is generated from the comparator 70 so that information of the foreign particles is written in a display (not shown) by the defect signal and the foreign particles on the mask are detected simultaneously with the scanning by the image sensor 60.

I claim:
1. A method of inspecting a pattern on a photomask or a reticle disposed at a first position on an exposure apparatus used in the manufacture of semiconductor devices for printing the pattern onto a wafer disposed at a second position on said exposure apparatus, said method comprising the steps of:
   (a) providing a photosensitive member at said second position of said exposure apparatus instead of said wafer, said member being formed by a transparent substrate and a photosensitive layer of a photosensitive material provided on said transparent substrate, said photosensitive material having light transmittance lower than said substrate;
   (b) successively exposing a plurality of different areas in said photosensitive member by using said exposure apparatus and said photomask or reticle for printing a plurality of identical patterns on said areas, respectively;
   (c) developing said exposed photosensitive member and forming on said photosensitive member printed patterns provided by said transparent substrate and said photosensitive layer;
   (d) inspecting said developed photosensitive member in a transmitted illuminating light and generating an image signal corresponding to said printed patterns and detecting defects in said printed patterns in accordance with said image signal; and
   (e) comparing said printed patterns with each other in relation to said defects and discriminating that the defects are caused by said photomask or reticle when said defects have been detected in common within said printed patterns.

2. A method according to claim 1, wherein said exposure apparatus includes a projection optical system disposed between said first and second positions.

3. A method according to claim 1, wherein said detecting step includes the steps of generating design data corresponding to a design pattern and comparing said image signal with said design data.

4. A method of inspecting a pattern on a photomask disposed at a first position on an exposure apparatus used in the manufacture of semiconductor devices for printing the pattern onto a wafer disposed at a second position on said exposure apparatus, said method comprising the steps of:
- (a) providing a photosensitive member at said second position of said exposure apparatus instead of said wafer, said member being formed by a transparent substrate and a photosensitive layer of a photosensitive material provided on said transparent substrate, said photosensitive material having light transmittance lower than said substrate;
- (b) successively exposing a plurality of different areas in said photosensitive member by using said exposure apparatus and said photomask for printing a plurality of identical patterns on said areas, respectively;
- (c) developing said exposed photosensitive member and forming on said photosensitive member printed patterns provided by said transparent substrate and said photosensitive layer;
- (d) inspecting said developed photosensitive member in a transmitted illuminating light and generating an image signal corresponding to said printed patterns and detecting defects in said printed patterns in accordance with said image signal; and
- (e) copmparing said printed patterns with each other in relation to said defects and determining whether the defects are caused by said photomask or said photosensitive member.

5. A method according to claim 4, wherein said exposure apparatus includes a projection optical system disposed between said first and second positions.

6. A method according to claim 4, wherein said detecting step includes the steps of generating design data corresponding to a design pattern and comparing said image signal with said design data.

7. A method of inspecting a pattern on a photomask or a reticle disposed at a first position on an exposure apparatus used in the manufacture of semiconductor devices for printing the pattern onto a wafer disposed at a second position on said exposure apparatus, said method comprising the steps of:
- (a) providing a photosensitive member at said second position of said exposure apparatus instead of said wafer, said member being formed by a transparent substrate, a light shielding layer of an opaque material formed on said substrate and a photosensitive layer of a photosensitive material provided on said transparent substrate, said photosensitive material being formed on said light shielding layer;
- (b) successively exposing a plurality of different areas in said photosensitive member by using said exposure apparatus and said photomask or reticle for printing a plurality of identical patterns on said areas, respectively;
- (c) developing said exposed photosensitive member, etching said light shielding layer of said photosensitive member and forming on said photosensitive member printed patterns provided by said transparent substrate and said light shielding layer;
- (d) inspecting said developed photosensitive member in a transmitted illuminating light and generating an image signal corresponding to said printed patterns and detecting defects in said printed patterns in accordance with said image signal; and
- (e) comparing said printed patterns with each other in relation to said defects and discriminating that the defects are caused by said photomask or reticle when said defects have been detected in common within said printed patterns.

8. A method of inspecting a pattern on a photomask disposed at a first position on an exposure apparatus used in the manufacture of semiconductor devices for printing the pattern onto a wafer disposed at a second position on said exposure apparatus, said method comprising the steps of:
- (a) providing a photosensitive member at said second position of said exposure apparatus instead of said wafer, said member being formed by a transparent substrate, a light shielding layer of an opaque material formed on said substrate and a photosensitive layer of a photosensitive material provided on said transparent substrate, said photosensitive material being formed on said light shielding layer;
- (b) successively exposing a plurality of different areas in said photosensitive member by using said exposure apparatus and said photomask for printing a plurality of identical patterns on said areas, respectively;
- (c) developing said exposed photosensitive member, etching said light shielding layer of said photosensitive member and forming on said photosensitive member printed patterns provided by said transparent substrate and said light shielding layer;
- (d) inspecting said developed photosensitive member in a transmitted illuminating light and generating an image signal corresponding to said printed patterns and detecting defects in said printed patterns in accordance with said image signal; and
- (e) comparing said printed patterns with each other in relation to said defects and determining whether the defects are caused by said photomask or said photosensitive member.

* * * * *